(12) United States Patent
Chen et al.

(10) Patent No.: US 6,190,962 B1
(45) Date of Patent: Feb. 20, 2001

(54) METHOD OF FABRICATING CAPACITOR

(75) Inventors: Anchor Chen, Pingtung; Jing-Horng Gau, Hsinchu Hsien, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/467,590

(22) Filed: Dec. 20, 1999

(51) Int. Cl.$^7$ .............................................. H01L 21/8242
(52) U.S. Cl. ...................... 438/253; 438/254; 438/255; 438/256; 438/396
(58) Field of Search .................... 438/396, 253, 438/239, 387, 244, 574, 255, 256, 254

(56) References Cited

U.S. PATENT DOCUMENTS

| | | | |
|---|---|---|---|
| 5,460,996 | * 10/1995 | Ryou | 437/52 |
| 5,741,722 | * 4/1998 | Lee | 437/60 |
| 5,766,995 | * 6/1998 | Wu | 438/255 |
| 5,981,333 | * 11/1999 | Parekh et al. | 438/253 |
| 6,037,213 | * 3/2000 | Shih et al. | 438/253 |
| 6,037,234 | * 3/2000 | Hong et al. | 438/396 |

* cited by examiner

*Primary Examiner*—Matthew Smith
*Assistant Examiner*—V. Yevsikov
(74) *Attorney, Agent, or Firm*—Charles C. H. Wu; Charles C. H. Wu & Associates

(57) ABSTRACT

A fabrication method for a capacitor is proposed, beginning with a semiconductor substrate having a bit line and a planarized first dielectric layer formed thereon. A first silicon nitride layer is formed on the first dielectric layer, followed by forming in sequence a second dielectric layer and a second silicon nitride layer on the first silicon nitride layer. A photolithography and etching process is performed to form an opening in the second dielectric layer and the second silicon nitride layer. A conducting spacer is formed on a sidewall of the opening. With the spacer serving as a mask, the first silicon nitride layer and the first dielectric layer are etched to form a terminal contact opening. A conducting layer is then formed to cover the second silicon nitride layer and to fill the terminal contact opening, while the conducting layer on the second silicon nitride layer is removed by etching back. The second silicon nitride layer and the second dielectric layer are removed to expose a part of the conducting layer. A hemispherical grain layer is coated on the exposed surface of the conducting layer to complete manufacture of a lower electrode, while the lower electrode is covered by a dielectric film and an upper electrode to complete manufacture of the capacitor.

10 Claims, 7 Drawing Sheets

METHOD OF FABRICATING CAPACITOR

BACKGROUND OF THE INVENTION

1. Field of Invention

The present invention relates to a fabrication method for an integrated circuit (IC). More particularly, the present invention relates to a method for fabricating a dynamic random access memory (DRAM) capacitor.

2. Description of Related Art

Dynamic random access memory (DRAM) is a circuit structure that increases the integrated circuit (IC) density, and is widely used for storing information in the electrical industry. The mode of storing information or data is determined by the charged state of a capacitor in a memory cell, while the information is accessed by the memory cell and a read/program circuit peripheral to the wafer.

The memory cell developed at present is made of a transfer field effect transistor (TFET) and a storage capacitor. FIG. 1 is a circuit diagram illustrating memory elements of a DRAM device. From the diagram, it can be seen that a capacitor (C) is screened from the arrays of capacitors on the surface of the semiconductor substrate, which capacitor stores the data by using its discharging characteristics. This is commonly achieved by storing binary bit data into all capacitors, where each capacitor shows a logic zero when it is uncharged, and a logic one when it is charged.

Usually, there is a dielectric layer 102 between an upper electrode 101 and a lower electrode 100 of the capacitor (C) to provide a required dielectric constant between the electrodes. The capacitor is in turn coupled to a bit line (BL), wherein the capacitor is discharged to perform a read/program function. The charging/discharging state of the capacitor is switched by the TFET. This method comprises connecting the bit line (BL) to the source of the TFET, connecting the capacitor (C) to the drain of the TFET, and sending a signal in the word line (WL) to the gate of the TEFT. Accordingly, the method determines whether the capacitor (C) is connected to the bit line (BL).

As the number of transistors on the conventional DRAM wafer increases with a gradual decrease in the transistor size, it becomes difficult to maintain the capacitor within an acceptable range of signal-to-noise ratio level when it is storing charges. On the other hand, if the capacitor storage capacity is decreased to reduce the noise, the refresh cycles of the signal storage charges are necessarily increased.

As the area occupied by the capacitor is limited by the size of the memory cell, it is necessary to develop a more effective capacitor, which provides a large capacitance as desired, while not increasing the horizontal space occupied on the substrate. As a result, the rule of the semiconductor process is satisfied. The most common capacitor structures generally include a trench capacitor, a cylinder capacitor, and a stacked capacitor. Among these capacitors, the trench capacitor is seldom considered because it is difficult to make. The cylinder capacitor and the stacked capacitor are structures that extend vertically upwards from the substrate, so that the surface area of the capacitor is largely increased and the capacitors have different design structures. However, numerous repetitive steps involved in manufacturing the cylinder capacitor or the stacked capacitor increase the process complexity and the manufacturing cost.

FIGS. 2A through 2D illustrate steps for fabricating conventional DRAM cylinder capacitor.

Referring to FIG. 2A, a semiconductor substrate 200 is provided with a dielectric layer 202 formed thereon. A photolithography and etching process is performed to form a contact opening 204 in the dielectric layer 202, so that a part of the semiconductor substrate 200 is exposed.

Referring to FIG. 2B, a conducting layer 206, which is made of amorphous silicon, is formed on the dielectric layer 202 to fill the contact opening 204. A photolithography and etching process is further performed to remove a part of the conducting layer 206, so that a lower electrode 208 which connects to the semiconductor substrate 200 is formed on the dielectric layer 202, as shown in FIG. 2C.

Referring to FIG. 2D, a hemispherical grain (HSG) layer is coated on the lower electrode 208, so that a HSG lower electrode 210 with an increased surface area is formed.

Generally, it takes a long time to deposit an amorphous silicon layer. Therefore, as it is necessary to increase the thickness of the amorphous silicon layer in order to meet the demand for increased capacitance, the time for depositing the amorphous layer inevitably becomes longer. Furthermore, the manufacture of a lower electrode of the capacitor includes etching the amorphous silicon layer, which not only involves etching the silicon layer in the memory cell, but also removing the silicon layer in the peripheral region. As a result, a height difference between the cell memory and the peripheral region makes up a thickness sum of a lower electrode, a dielectric film, and an upper electrode. With an increased thickness of the silicon layer being deposited, the height difference between the cell memory and the peripheral region for manufacturing the capacitor increases. Therefore, a dielectric layer is usually deposited after the manufacture of the capacitor, followed by performing chemical mechanical polishing (CMP) to achieve a global planarization.

SUMMARY OF THE INVENTION

The invention provides a fabrication method for a capacitor, which method provides a semiconductor substrate with a bit line and a planarized first dielectric layer formed thereon. A first silicon nitride layer is formed on the first dielectric layer, followed by forming in sequence a second dielectric layer and a second silicon nitride layer on the first silicon nitride layer. A photolithography and etching process is performed to form an opening in the second dielectric layer and the second silicon nitride layer. A conducting spacer is formed on a sidewall of the opening. With the spacer serving as a mask, the first silicon nitride layer and the first dielectric layer are etched to form a terminal contact opening. A conducting layer is then formed to cover the second silicon nitride layer and to fill the terminal contact opening, while the conducting layer on the second silicon nitride layer is removed by etching back. The second silicon nitride layer and the second dielectric layer are removed to expose a part of the conducting layer. A hemispherical grain (HSG) layer is coated on the exposed part of the conducting layer to complete manufacture of a lower electrode, while the lower electrode is covered by a dielectric film and an upper electrode to complete manufacture of the capacitor.

As embodied and broadly described herein, the invention provides a fabrication method for a capacitor, by which a thickness of the conducting layer is approximately equal to a radius of the terminal contact opening, so that the capacitance is controlled through adjusting the thickness of the second dielectric layer. Therefore, the thickness of the conducting layer is not directly related to the capacitance, regardless of the amount of the capacitance. So, the time required for depositing the conducting layer remains unchanged.

According to the present invention, only the second dielectric layer above the capacitor region is removed to expose the lower electrode when the lower electrode is manufactured. After the manufacture of the capacitor, the height difference between the peripheral region and the capacitor region merely constitutes the thicknesses of the dielectric film and the upper electrode, wherein the height difference is much smaller than that of the conventional capacitor. Thus, a planarization step, which involves CMP, can be skipped to simplify the whole process. In addition, terminal contact opening is formed in a self-aligned manner, so a patterning step using a mask would be redundant in the process. Therefore, the overall process is simplified with reduced process complexity.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 3A through 3H illustrate steps for fabricating a capacitor according to one preferred embodiment of the invention.

Figure 1:
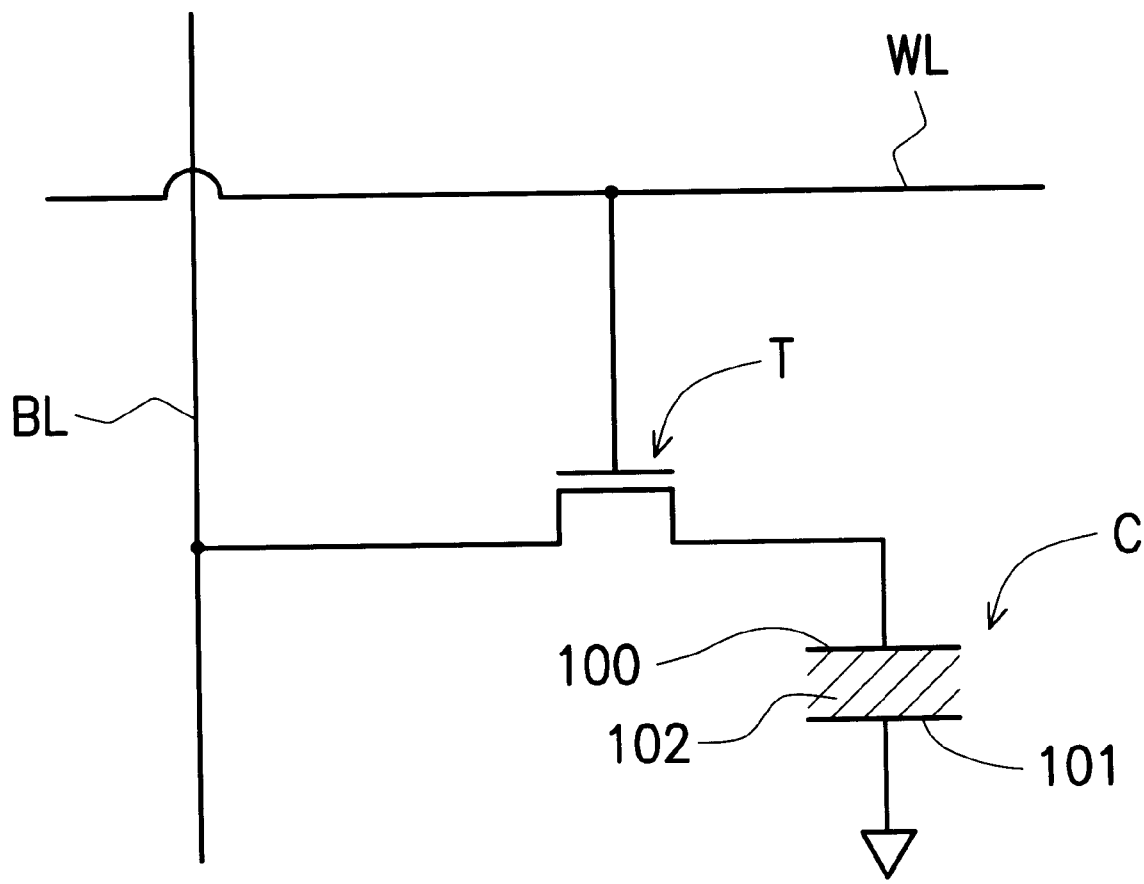
FIG. 1 is a circuit diagram illustrating memory elements of a DRAM device.
Figure 2A:
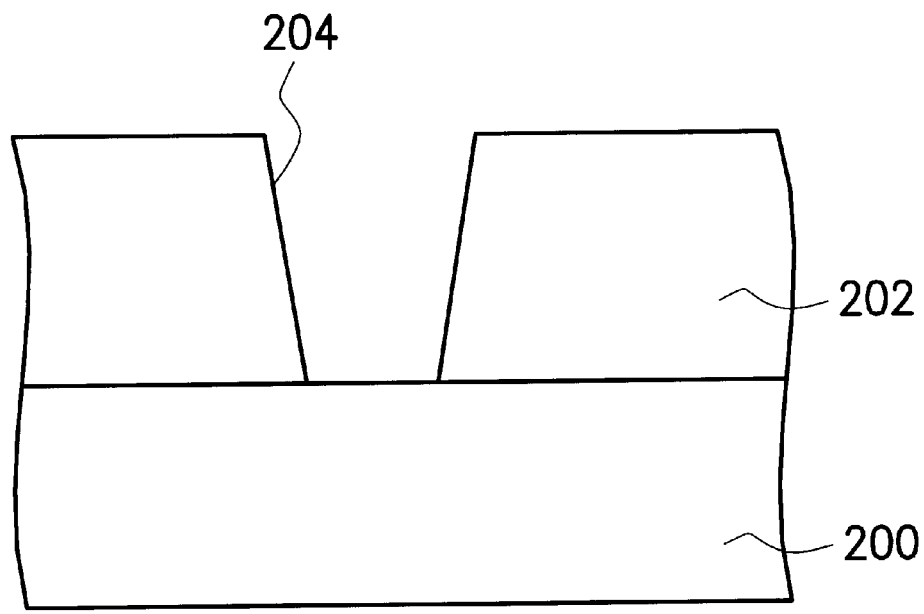
FIGS. 2A through 2D illustrate steps for fabricating conventional DRAM cylinder capacitor.
Figure 2B:
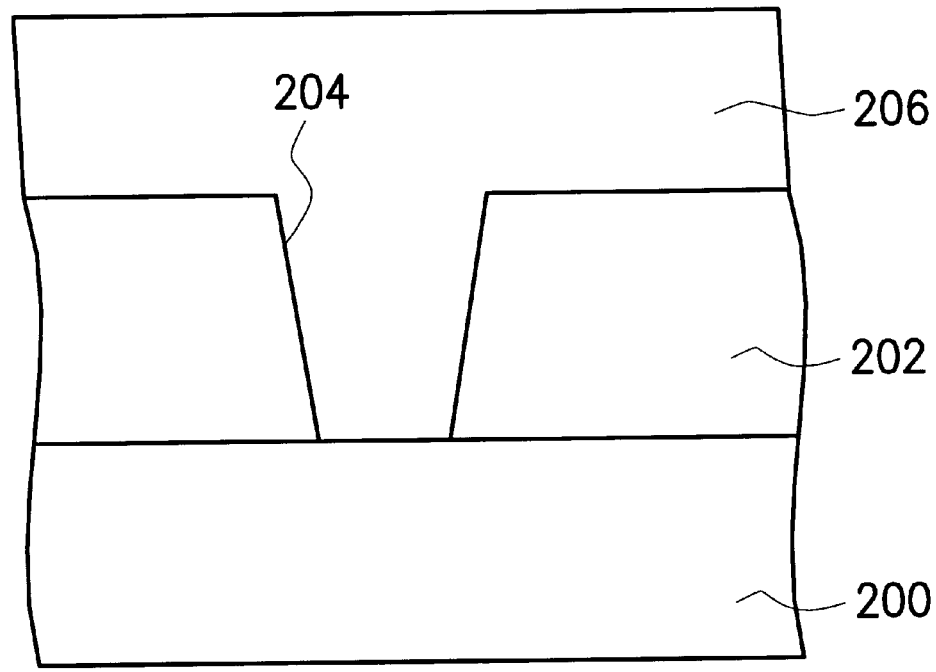
Figure 2C:
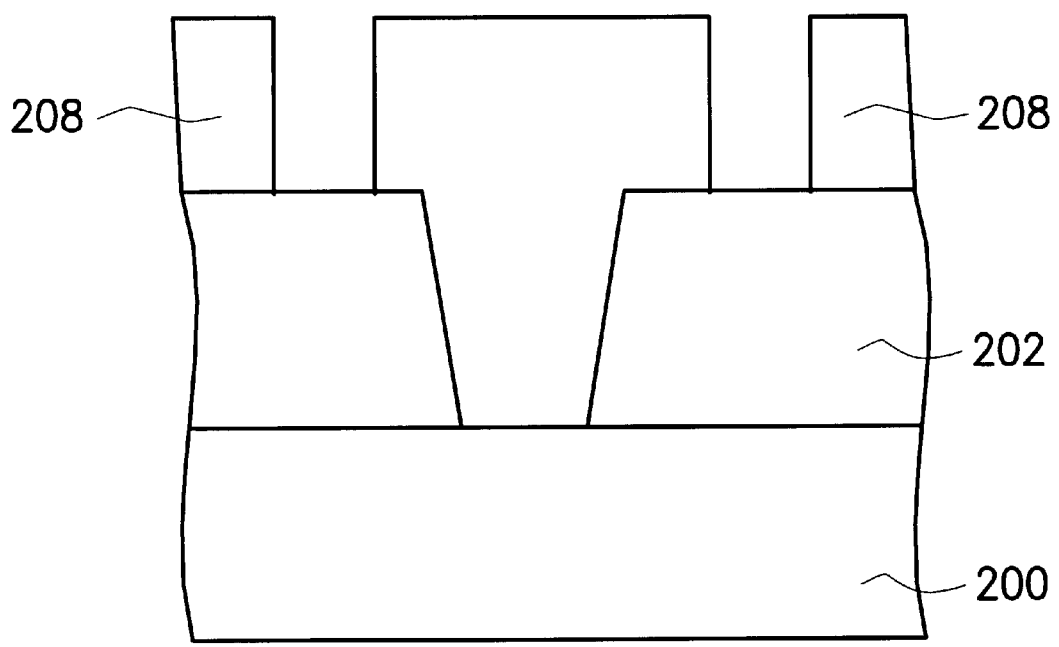
Figure 2D:
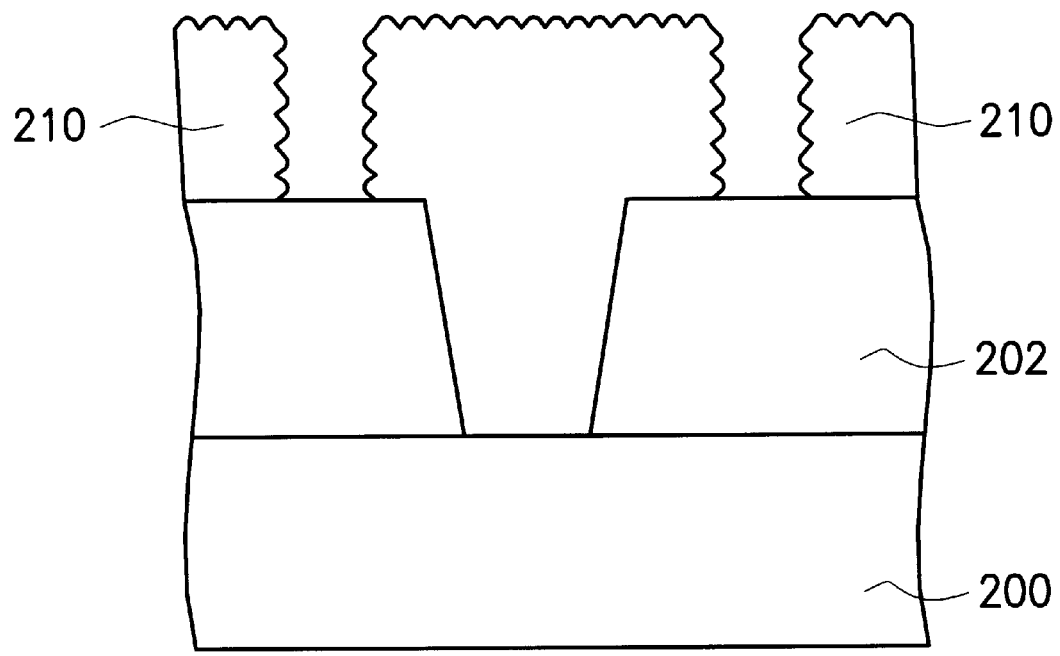
Figure 3A:
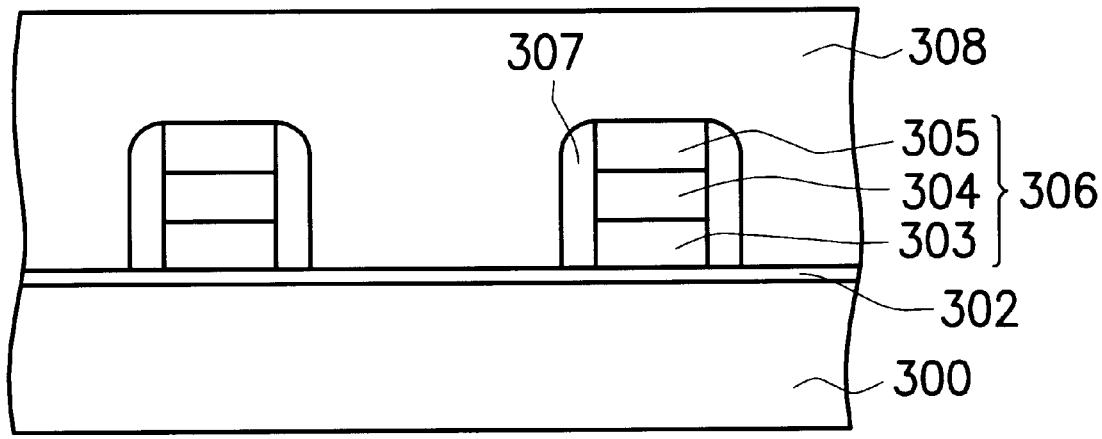
FIGS. 3A through 3H illustrate steps for fabricating a capacitor according to one preferred embodiment of the invention.

Referring to FIG. 3A, a semiconductor substrate 300 is provided, on which is formed a gate oxide layer 302, a conducting structure 306, and a spacer 307 on a sidewall of the conducting structure 306. The conducting structure 306 comprises a polysilicon layer 303 formed on the gate oxide layer 302, a tungsten silicide layer 304 formed on the polysilicon layer 303, and a silicon nitride layer 305 formed on the tungsten silicide layer 304. The conducting structure 306 in this case can serve as a bit line or a gate for a MOS transistor. Also, the whole semiconductor substrate 300 is covered with a planarized dielectric layer 308, preferably made of silicon dioxide.

Figure 3B:
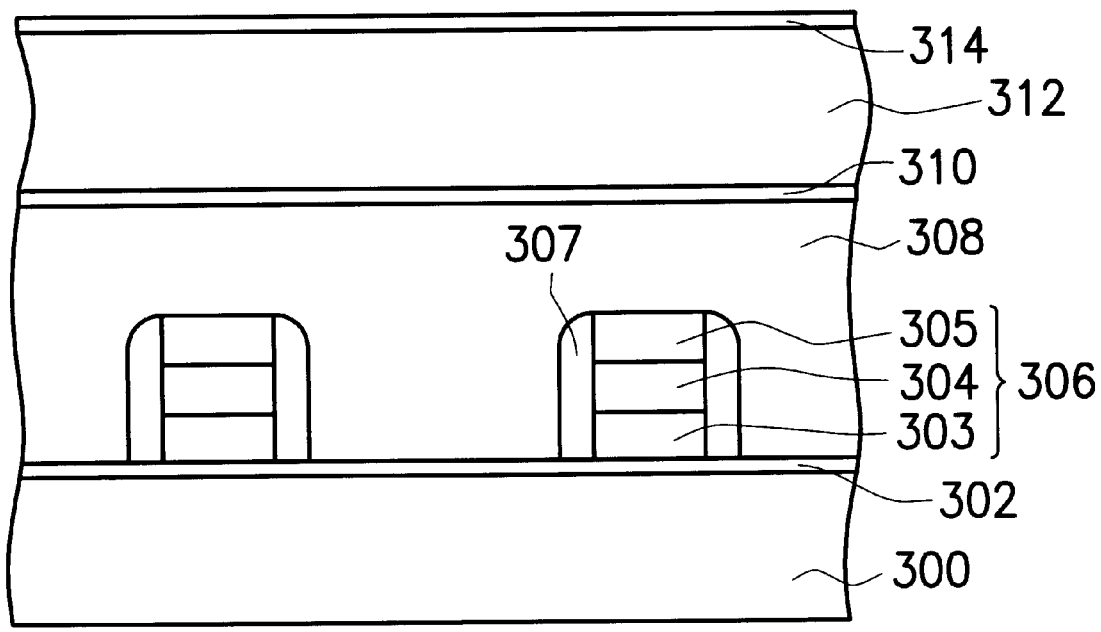
Figure 3C:
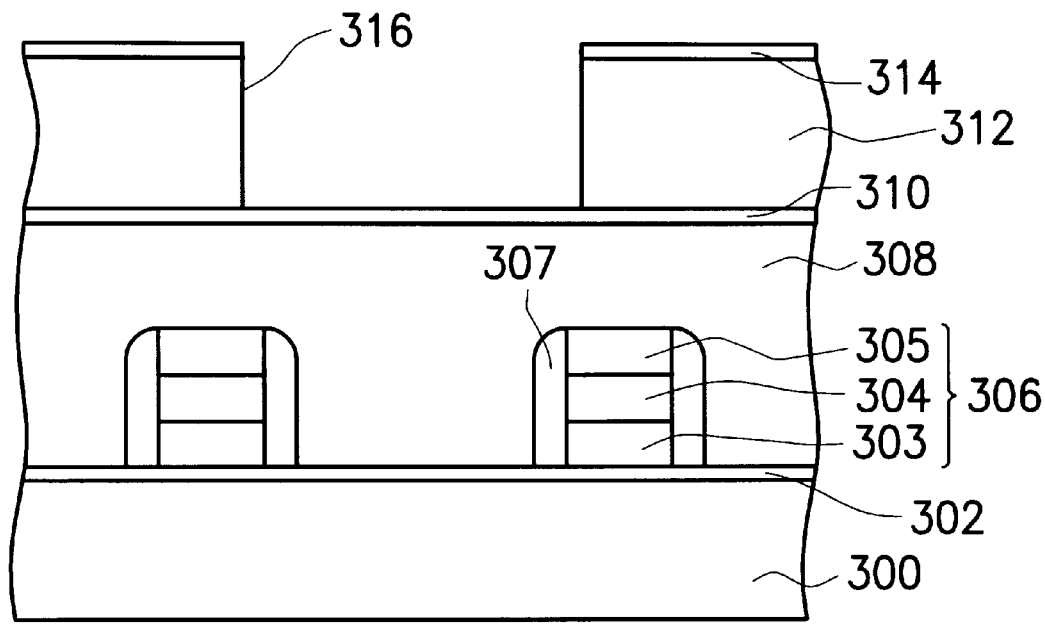

Referring to FIG. 3B, a silicon nitride layer 310, a dielectric layer 312, and another silicon nitride layer 314 are formed in sequence on the dielectric layer 308. A photolithography and etching process is performed to form an opening 316 in the dielectric layer 312 and the silicon nitride layer 314, wherein the opening 316 corresponds to a location for forming the capacitor as shown in FIG. 3C, while the dielectric layer 312 is made of silicon dioxide.

Figure 3D:
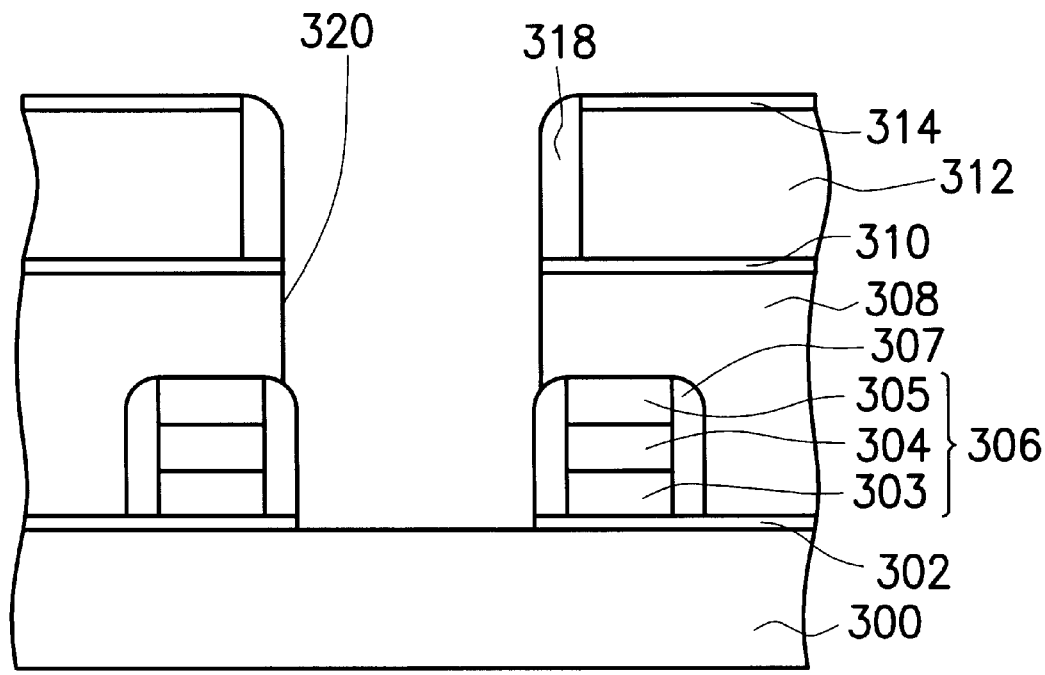

Referring to FIG. 3D, the structure described above is covered with a conducting layer, followed by etching back to remove a part of the conducting layer, so that a conducting spacer 318 is formed on a sidewall of the opening 316. Preferably, the conducting material includes amorphous silicon. With the conducting spacer 318 and the silicon nitride layer 314 serving as a mask, the silicon nitride layer 310 and the dielectric layer 308, and the underlying gate oxide layer 302 are etched until a part of the semiconductor substrate 300 is exposed so as to form a terminal contact opening 320. The etching step involved for forming the terminal contact opening 320 is performed in a self-aligned manner, since the terminal contact opening 320 is formed without performing a photolithographic process.

From the relevant diagram described above, it is understood that the silicon nitride layer 314 is etched while etching the silicon nitride layer 310. Also, it is seen from the diagram that silicon nitride layer 314 is still available when the terminal contact opening 320 is formed by etching. This implies that the silicon nitride layer 314 is thicker than the silicon nitride layer 310, according to the embodiment of present invention.

Figure 3E:
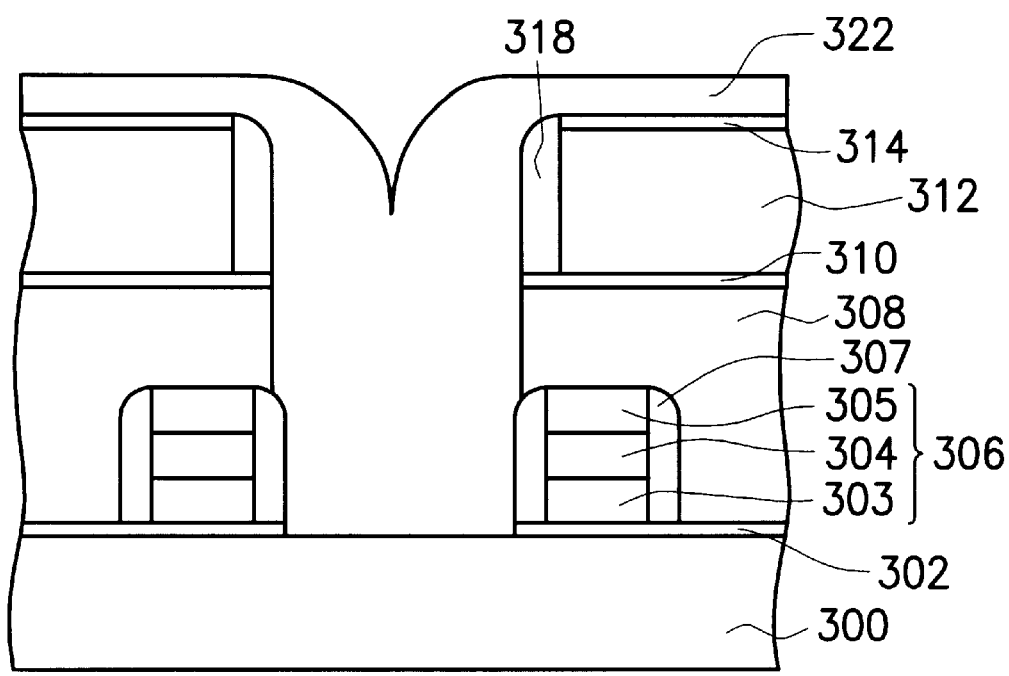

Referring to FIG. 3E, the whole structure described above is covered with a conducting layer 322, which fills the terminal contact opening 320. The conducting layer 322 includes amorphous silicon and has a thickness approximately equal to the radius of the terminal contact opening 320. As a result, most of the terminal contact opening 320 is filled with the conducting layer 322.

Figure 3F:
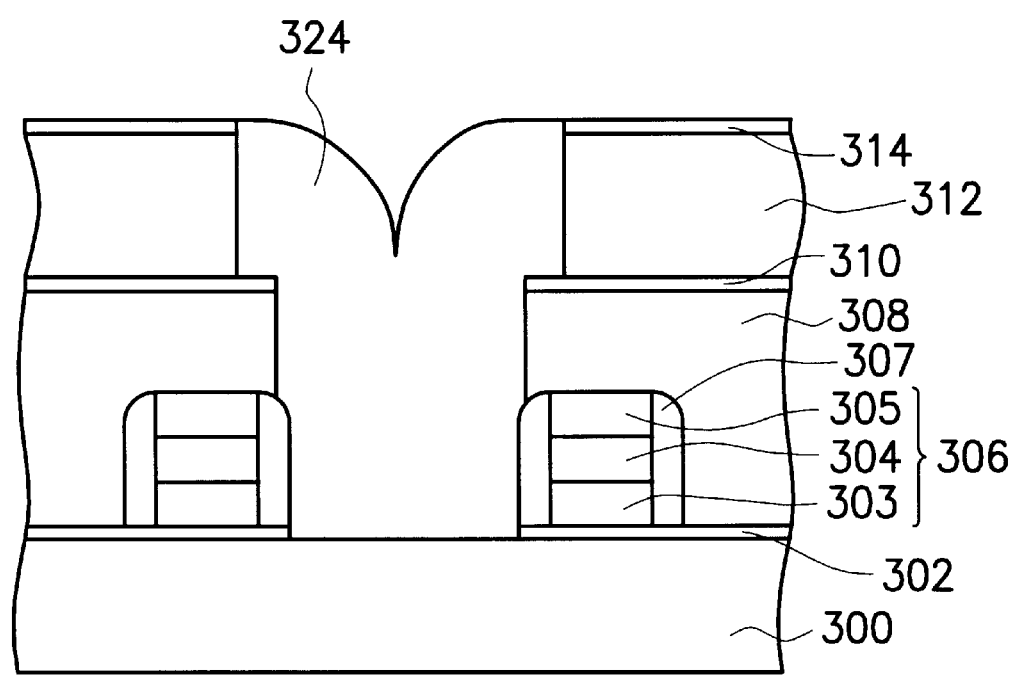

Referring to FIG. 3F, the conducting layer 322 above and on the silicon nitride layer 314 is removed; the method includes removing the conducting layer 322 by etching back until the silicon nitride layer 314 is exposed. Since the conducting spacer 318 and the conducting layer 322 are made of the same material, they combine in the terminal contact opening 320 to form a cylindrical lower electrode 324.

Figure 3G:
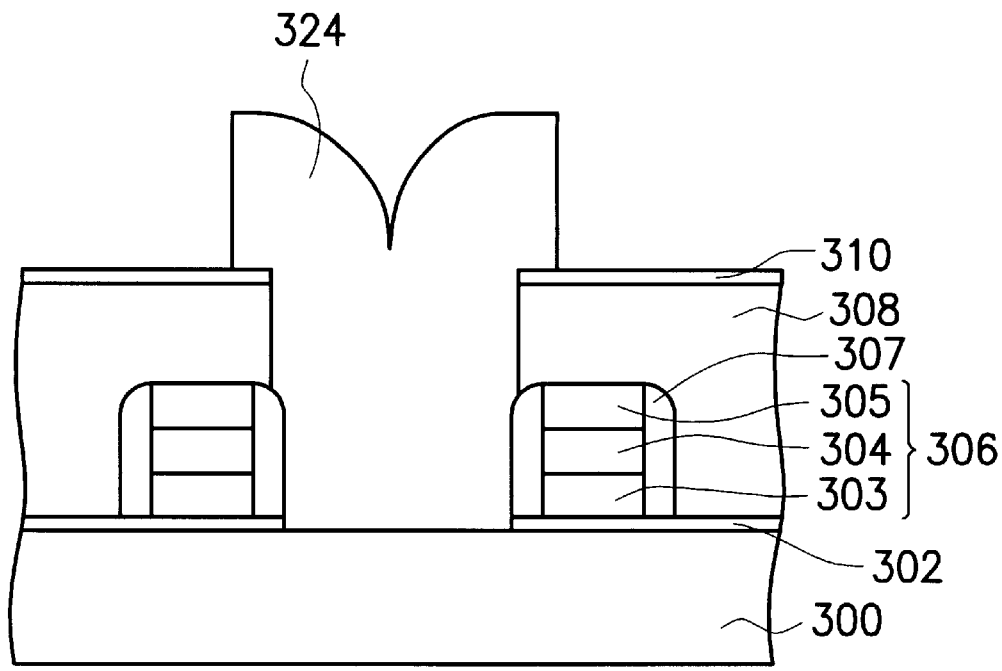

Referring to FIG. 3G, the silicon nitride layer 314 and the dielectric layer 312 are removed in sequence to expose a cylindrical portion of the lower electrode 324.

Figure 3H:
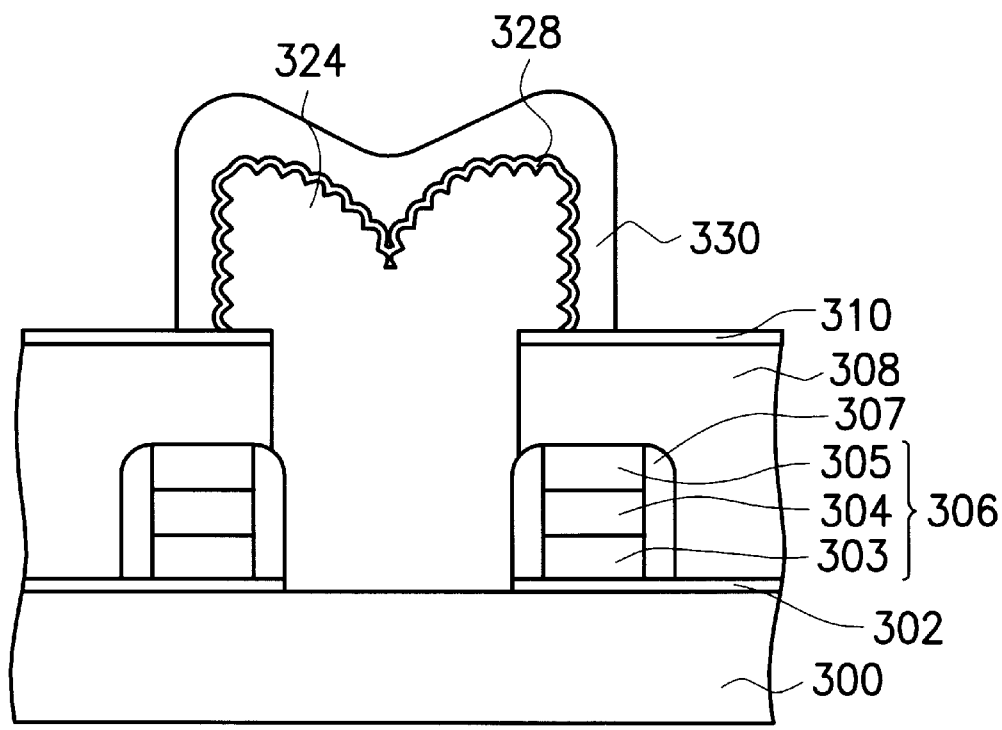

Referring to FIG. 3H, the exposed portion of the lower electrode 324 is coated with a hemispherical grain (HSG) layer, so that a HSG lower electrode 326 is formed and has an increased surface area. A dielectric film 328 is formed to cover the lower electrode 326, wherein the dielectric film 328 may include an oxide-nitride-oxide (ONO) structure. Subsequently, a conducting upper electrode 330 is formed on the dielectric film 328 to complete the manufacture of the capacitor.

Summarizing the above, it is understood that the thickness of the conducting layer is approximately equal to a radius of the terminal contact opening, so that the capacitance is controlled through adjusting the thickness of the second dielectric layer. Therefore, the thickness of the conducting layer is not directly related to the capacitance, regardless of the amount of the capacitance. It is not necessary to increase the thickness of the conducting layer when the capacitance is increased, thus reducing the time required for depositing the conducting layer.

Furthermore, only the second dielectric layer on the capacitor region is removed to expose the lower electrode when the lower electrode is manufactured. After the manufacture of the capacitor, the height difference between the peripheral region and the capacitor region merely constitutes the thicknesses of the dielectric film and the upper electrode, wherein the height difference is much smaller than that of the conventional capacitor. Thus, a planarization step, which involves CMP, can be skipped to simplify the whole process.

In addition, the terminal contact opening is formed in a self-aligned manner, so a patterning step using a mask would be redundant in the process. Therefore, the overall process is simplified with reduced process complexity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a capacitor, which is applicable to a semiconductor substrate with at least on bit line formed thereon, comprising forming a first dielectric layer for covering the semiconductor substrate, wherein the first dielectric layer has a planar top surface forming a first silicon nitride layer on the first dielectric layer forming a second dielectric layer on the first silicon nitride layer;

forming a second silicon nitride layer on the second dielectric layer, wherein the second silicon nitride layer is thicker than the first silicon nitride layer;

removing a part of the second silicon nitride layer and second dielectric layer so as to form an opening;

forming a conducting spacer on a sidewall of the opening;

removing a part of the first silicon nitride layer and first dielectric layer through the opening until a part of the semiconductor substrate is exposed, so as to form a contact opening;

forming a conducting layer which covers the second silicon nitride layer and fills the contact opening;

removing a part of the conducting layer until the second silicon nitride layer is exposed, so that remaining conducting layer combines with the conducting spacer to form a lower electrode;

removing the second silicon nitride layer and the second dielectric layer;

forming a dielectric film for covering the lower electrode; and forming an upper electrode on the dielectric film.

2. The fabrication method of claim 1, wherein the first dielectric layer and the second dielectric layer include silicon dioxide.

3. The fabrication method of claim 1, wherein the conducting spacer includes amorphous silicon.

4. The fabrication method of claim 1, wherein the conducting layer includes amorphous silicon.

5. The fabrication method of claim 1, wherein the dielectric film is an oxide-nitride-oxide structure.

6. The fabrication method of claim 1, wherein the lower electrode further includes a hemi-spherical silicon surface.

7. The fabrication method of claim 1, wherein the step of removing a part of the conducting layer until the second silicon nitride layer is exposed, so that the remaining conducting layer combines with the conducting spacer to form a lower electrode, involves an etching back.

8. A fabrication method for a capacitor, comprising:

providing a semiconductor substrate, on which forms a planarized first silicon dioxide layer;

forming a first silicon nitride layer, a second silicon dioxide layer, and a second silicon nitride layer having a thickness areater than the first silicon nitride layer in sequence on the first silicon dioxide layer, wherein an opening is formed in the second silicon dioxide layer and the second silicon nitride layer to expose a part of the first silicon nitride layer;

forming a conducting spacer on a sidewall of the opening;

etching the first silicon nitride layer and the first silicon dioxide layer, with the conducting spacer serving as a mask, so as to form a contact opening which exposes the semiconductor substrate; and forming a conducting layer to fill the contact opening, wherein the conducting layer and the conducting spacer constitute a lower electrode.

9. The fabrication method of claim 8, wherein the conducting spacer and the conducting layer include amorphous silicon.

10. The fabrication method of claim 8, further including removing the second silicon nitride layer and the second silicon dioxide layer, and forming a hemi-spherical silicon crystalline structure after formation of the lower electrode, whereby a surface area of the lower electrode is increased.

* * * * *